United States Patent
Plessas et al.

(10) Patent No.: US 9,299,401 B2
(45) Date of Patent: Mar. 29, 2016

(54) DRIVER FOR DDR2/3 MEMORY INTERFACES

(75) Inventors: Fotis Plessas, Patras (GR); Efthimios Davrazos, Patras (GR); Michael Birbas, Patras (GR); John Kikidis, Patras (GR)

(73) Assignee: ANALOGIES SA, Patras Innovation Hub and Kastritsi, Patras (GR)

( * ) Notice: Subject to any disclaimer, the term of this patent is extended or adjusted under 35 U.S.C. 154(b) by 78 days.

(21) Appl. No.: 13/698,494

(22) PCT Filed: Jan. 27, 2011

(86) PCT No.: PCT/GR2011/000005
§ 371 (c)(1),
(2), (4) Date: Nov. 16, 2012

(87) PCT Pub. No.: WO2011/092526
PCT Pub. Date: Aug. 4, 2011

(65) Prior Publication Data
US 2013/0103898 A1    Apr. 25, 2013

(30) Foreign Application Priority Data
Jan. 27, 2010    (GR) .............................. 20100100052

(51) Int. Cl.
*G11C 7/10* (2006.01)
*G11C 11/4096* (2006.01)
*G11C 29/02* (2006.01)
*G11C 7/12* (2006.01)

(52) U.S. Cl.
CPC ................ *G11C 7/1072* (2013.01); *G11C 7/10* (2013.01); *G11C 7/1051* (2013.01); *G11C 7/1057* (2013.01); *G11C 7/1066* (2013.01); *G11C 7/1069* (2013.01); *G11C 7/1084* (2013.01); *G11C 11/4096* (2013.01); *G11C 29/02* (2013.01); *G11C 29/022* (2013.01); *G11C 29/028* (2013.01); *G11C 7/1078* (2013.01); *G11C 7/12* (2013.01); *G11C 2207/2254* (2013.01)

(58) Field of Classification Search
CPC ........... G11C 7/12; G11C 7/1072; G11C 7/10
USPC .................................................. 711/104, 105
See application file for complete search history.

(56) References Cited

U.S. PATENT DOCUMENTS

| | | | |
|---|---|---|---|
| 2009/0091349 A1* | 4/2009 | Bhakta et al. | 326/30 |
| 2010/0202227 A1* | 8/2010 | Nguyen et al. | 365/198 |
| 2011/0084725 A1* | 4/2011 | Bhakta et al. | 326/30 |

* cited by examiner

*Primary Examiner* — Than Nguyen
(74) *Attorney, Agent, or Firm* — Franco S. De Liguori; DP IP Group

(57) ABSTRACT

An apparatus is described that includes a combined drive and termination circuit programmable to interface to DDR2 and DDR3 memory modules. In an exemplary embodiment the apparatus includes a combined output/termination driver, an input driver and a calibration subsystem. The combined output/termination driver includes a number of pull-up circuits and a number of pull-down circuits. One of the pull-up circuits presents a fixed output impedance. The rest of the pull-up circuits have an impedance programmable between two desired impedance values. One of the pull-down circuits presents a fixed output impedance. The rest of the pull-down circuits have an impedance programmable between two desired impedance values. The necessary number of pull-up circuits and pull-down circuits is activated in order to provide a desired driving and termination circuit such as to interface to specific impedance values as defined by the DDR2 and DDR3 interface protocol.

20 Claims, 6 Drawing Sheets

DRIVER FOR DDR2/3 MEMORY INTERFACES

TECHNICAL FIELD

The present disclosure relates generally to electronics, and more specifically to a driver for interfacing to memory modules.

BACKGROUND

Computer systems and other electronic systems rely on the communication of digital data. Synchronous Dynamic Random Access Memory (SDRAM) devices are commonly used in computer systems and such SDRAM devices cooperate with processor devices to support data read and write operations. The Joint Electron Device Engineering Council (JEDEC) publishes specifications related to double data rate (DDR) SDRAM devices.

JEDEC created a standard for the Stub Series Terminated Logic (SSTL) drivers in order to provide a termination mechanism for high-speed signaling applications such as DDR-SDRAM memories. Although both the memory operation frequencies and the requirements for faster memory interfaces continue to increase, the STTL standard is still widely accepted. Current memory systems are predominantly based on the DDR3 and DDR2 standard.

An SSTL driver for DDR2 memories includes an input driver, an output driver and a termination driver. It supports a maximum frequency of 533 MHz and operates under supply voltage of 1.8V. The output driver has an output impedance of 18 Ohm and the termination driver presents impedance of 50 Ohm, 75 Ohm, 150 Ohm and when interruptible it achieves infinite resistance. On the other hand, the SSTL driver for DDR3 memories consists of an input driver and the merged output driver/termination driver. It supports a maximum frequency speed of 800 MHz and operates under a supply voltage of 1.5V. The output driver has an output impedance of 34 Ohm and the termination driver achieves impedances of 120 Ohm, 60 Ohm, 40 Ohm, 30 Ohm and 20 Ohm.

Thus the same driver cannot support both standards (DDR2 and DDR3), nor can operate under different supplies. Typically different drivers are used to support DDR2 and DDR3 systems.

Thus, it is desirable and advantageous to have one driver for allowing a computer processor to interface with both DDR2 and DDR3 systems.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

An apparatus is proposed that provides a combined programmable drive and termination circuit for interfacing to both DDR2 and DDR3 memory modules.

The apparatus includes a combined output/termination driver, an input driver and a calibration subsystem. The combined output/termination driver, also referred to herein as output/termination driver, includes a plurality of pull-up circuits and a plurality of pull-down circuits. One of the pull-up circuits presents a fixed output impedance. The rest of the pull-up circuits have programmable impedance between two desired impedance values. One of the pull-down circuits presents a fixed output impedance. The rest of the pull-down circuits have a programmable impedance between two desired impedance values.

The necessary number of pull-up circuits and pull-down circuits is activated in order to provide a desired driving and termination circuit such as to interface with either a DDR2 or a DDR3 memory module and to present specific impedance values as defined by the DDR2 and DDR3 interface protocols.

Figure 1:
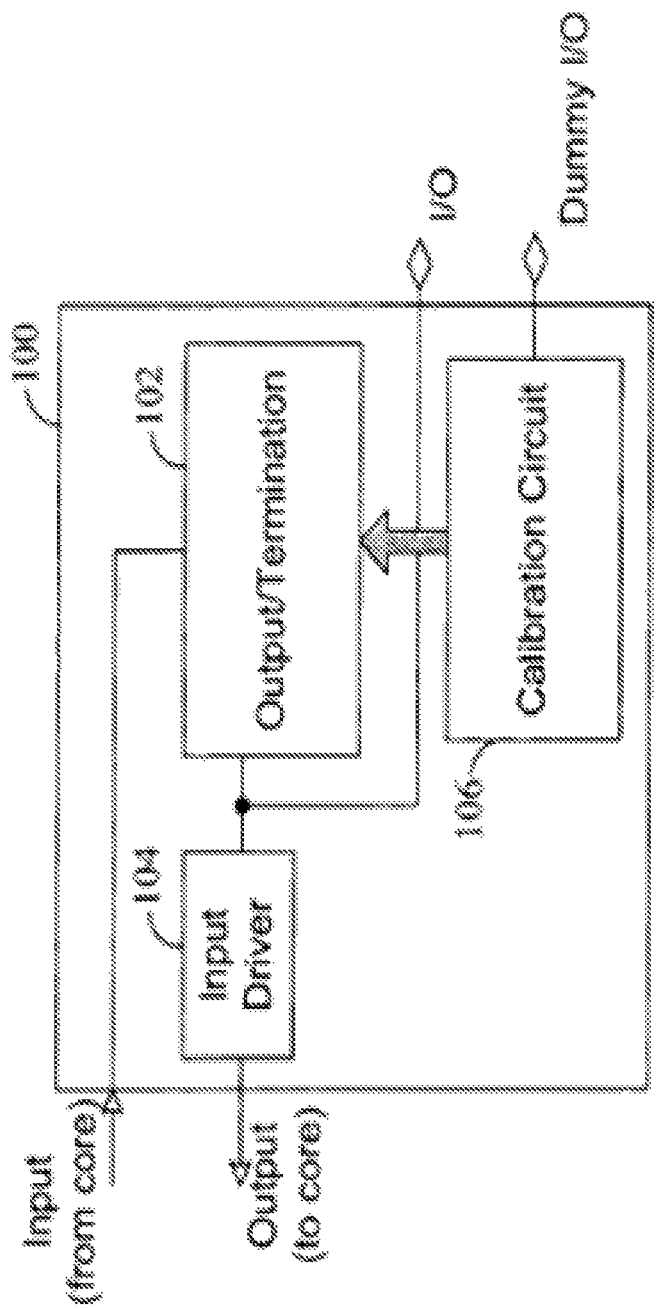
FIG. 1 shows an input/output driver for interfacing to DDR2 and DDR3 memory modules according to an exemplary embodiment.

FIG. 1 shows an input/output driver 100 for interfacing to DDR2 and DDR3 memory modules according to an exemplary embodiment. Input/output driver 100 comprises combined output/termination driver 102, input driver 104 and calibration circuit 106. Input driver 104 receives data from a DDR2 or a DDR3 memory module, senses and then amplifies the signal associated with the received data. Combined output/termination driver 102 presents a desired termination impedance to the signals received from the memory modules according to the termination impedance requirements as defined by the DDR3 and DDR2 protocol. When combined output/termination driver 102 operates as an output driver, it transmits data to the memory module. Combined output/termination driver 102 presents a termination impedance of either 50 Ohms, or 75 Ohms, or 150 Ohms and an output impedance of 18 Ohm, when interfacing to a DDR2 memory module. Combined output/termination driver 102 presents a termination impedance of either 120 Ohms, or 60 Ohms, or 40 Ohms, or 30 Ohms or 20 Ohms and an output impedance of 34 Ohms when interfacing to a DDR3 memory module, respectively.

Calibration circuit 106 is used to adjust (calibrate) the impedance presented by combined output/termination driver 102.

Figure 2:
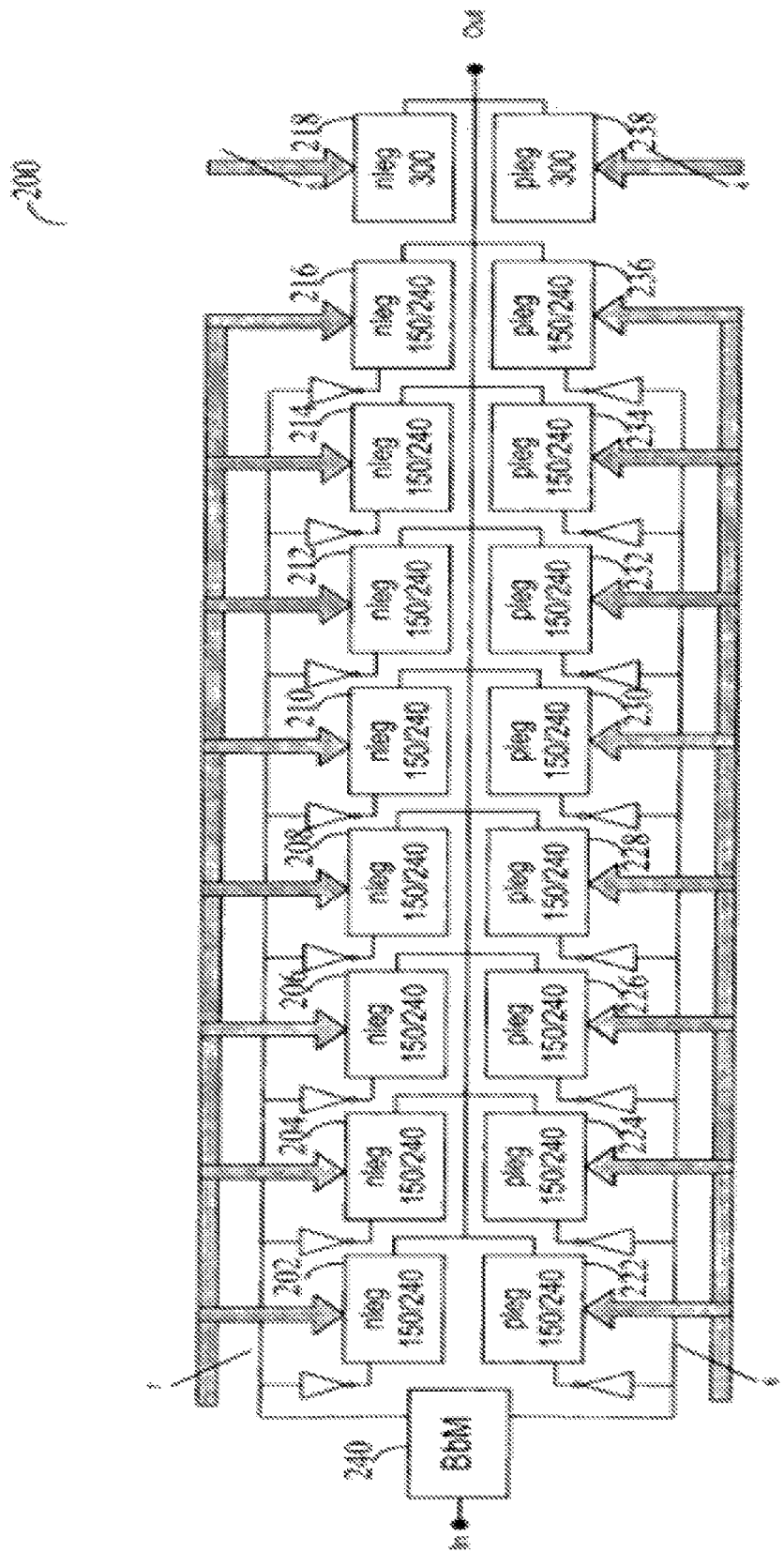
FIG. 2 shows an exemplary embodiment of a combined output/termination driver.

FIG. 2 shows an exemplary embodiment of a combined output/termination driver. Combined output/termination driver 200 includes a plurality of pull-up circuits 202, 204, 206, 208, 210, 212, 214, 216 and 218 (nine shown), a plurality of pull-down circuits 222, 224, 226, 228, 230, 232, 234, 236 and 238 (nine shown) and a break-before-make circuit (BbM) 240. In the specific embodiment of the combined output/termination driver presented in FIG. 2 the combined output/termination driver includes 9 pull-up circuits and 9 pull-down circuits and a break-before-make circuit (BbM). One of the pull-up circuits (218) presents a fixed impedance of a 300 Ohms One of the pull-down circuits (238) presents a fixed impedance of 300 Ohm. Each pull-down circuit and each pull-up circuit that presents a fixed impendence is activated only during operation according to the DDR2 protocol in order to provide a termination impedance of 150 Ohms.

Each of the remaining 8 pull-up and 8 pull-down circuits may be programmed to present either a 150 Ohm impedance or a 240 Ohm impedance. They are programmed to present a 150 Ohm impedance during operation according to the DDR2 protocol and they are programmed to present a 240 Ohm impedance during operation according the DDR3 protocol.

The activation of the appropriate number of pull-up and pull-down circuits, set to present either a 150 Ohm impedance or a 240 Ohm impedance, sets the termination impedance of the combined output/termination driver to the termination impedance required by either the DDR2 or the DDR3 protocol to interface with a DDR2 or a DDR3 memory module, respectively.

One skilled in the art would appreciate that a different number and/or configuration, than that shown in the example of FIG. 2, of pull-up and pull-down circuits, each having an appropriately programmable impedance, may be used and selectively be programmed to present the necessary impedance to interface to either a DDR2 or a DDR3 memory module.

Figure 3:
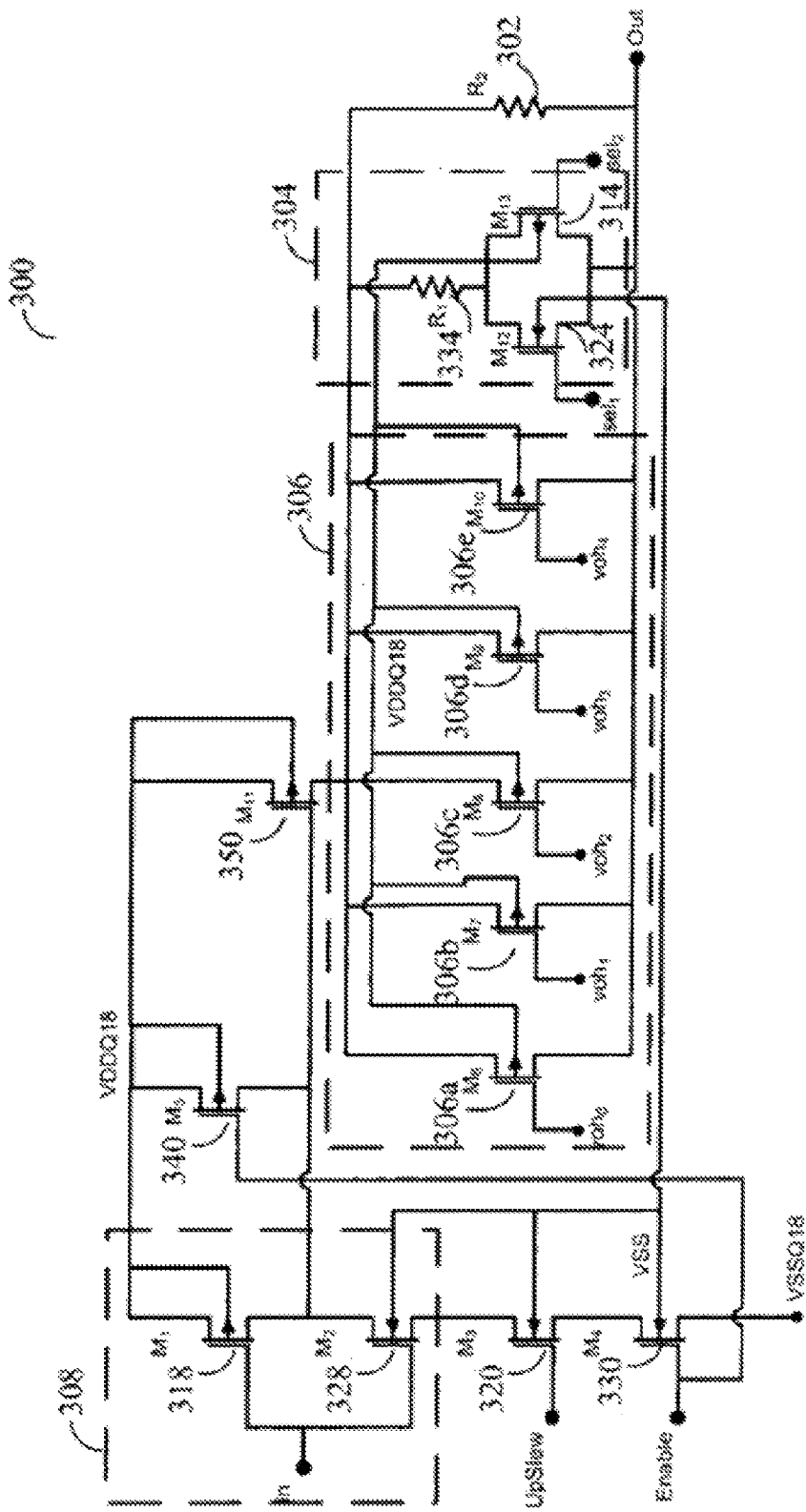
FIG. 3 shows a pull-up circuit with programmable impedance according to an exemplary embodiment.

FIG. 3 shows a pull-up circuit with programmable impedance according to an exemplary embodiment.

Pull-up circuit 300 includes resistor 302, selectable resistor 304 and a plurality of MOS transistors 306. Resistor 302 is coupled in parallel to selectable resistor 304. MOS transistors configuration 306 is coupled in parallel to resistor 302 and to selectable resistor 304. As a result, the total selectable impedance of each pull-up circuit is the sum of impedances presented by the parallel connection of resistor 302, selectable resistor 304 and MOS transistor configuration 306.

Selectable resistor 304 is not selected during operation according to the DDR3 protocol and it is only selected during operation according to the DDR2 protocol. MOS transistors configuration 306 comprises a number of MOS transistors (5 shown, 306a, 306b, 306c, 306d, 306e). During calibration a number of MOS transistors is selected in response to a calibration signal received in order to adjust (calibrate) the impedance value of the pull-up circuit to a desired value.

Pull-up circuit 300 further comprises input stage 308, slew rate control circuit 320, MOS transistors 330, 340 and 350. Input stage 308 receives an input signal and amplifies it. Slew rate control circuit 330 controls the slew rate of the pull-up circuit. MOS transistors 330 and 340 enable or disable pull-up circuit 300 in response to an external control signal. MOS transistor 350 is coupled to the output of input stage 308 and acts as a source follower that drives the parallel combination of resistor 302, selectable resistor 303 and MOS transistors configuration 306.

Resistor 302 is typically designed to have a resistance value larger than the desired impedance for the DDR2 operation. In the exemplary embodiment of FIG. 2 the desired impedance, during DDR2 operation, for each pull-up circuit is 150 Ohm. This allows the impedance of the pull-up circuit to be adjusted appropriately to the desired impedance value when a number of MOS transistors of the MOS transistors configuration 306 are selected. As a result the impedance of each pull-up circuit can be adjusted to the desired value, for example 150 Ohm, to account for process, voltage and temperature variation through the employment of the calibration mechanism.

Selectable resistor 304 comprises resistor 334 in series with a transmission gate that comprises of MOS transistors 314 and 324.

During DDR3 operation the transmission gate is off thus the selectable resistor is not selected. In this mode of operation the total impedance presented by the pull-up circuit is the impedance resulting from the parallel combination of resistor 302 and the MOS transistors from MOS transistors configuration 306 that are selected.

During DDR2 operation the transmission gate is on thus the selectable resistor is selected. In this mode of operation the total impedance presented by the pull-up circuit is the impedance resulting from the parallel combination of resistor 302, selected resistor 304 and the MOS transistors from MOS transistors configuration 306 that are selected in response to a first signal from the calibration subsystem (not shown).

Figure 4:
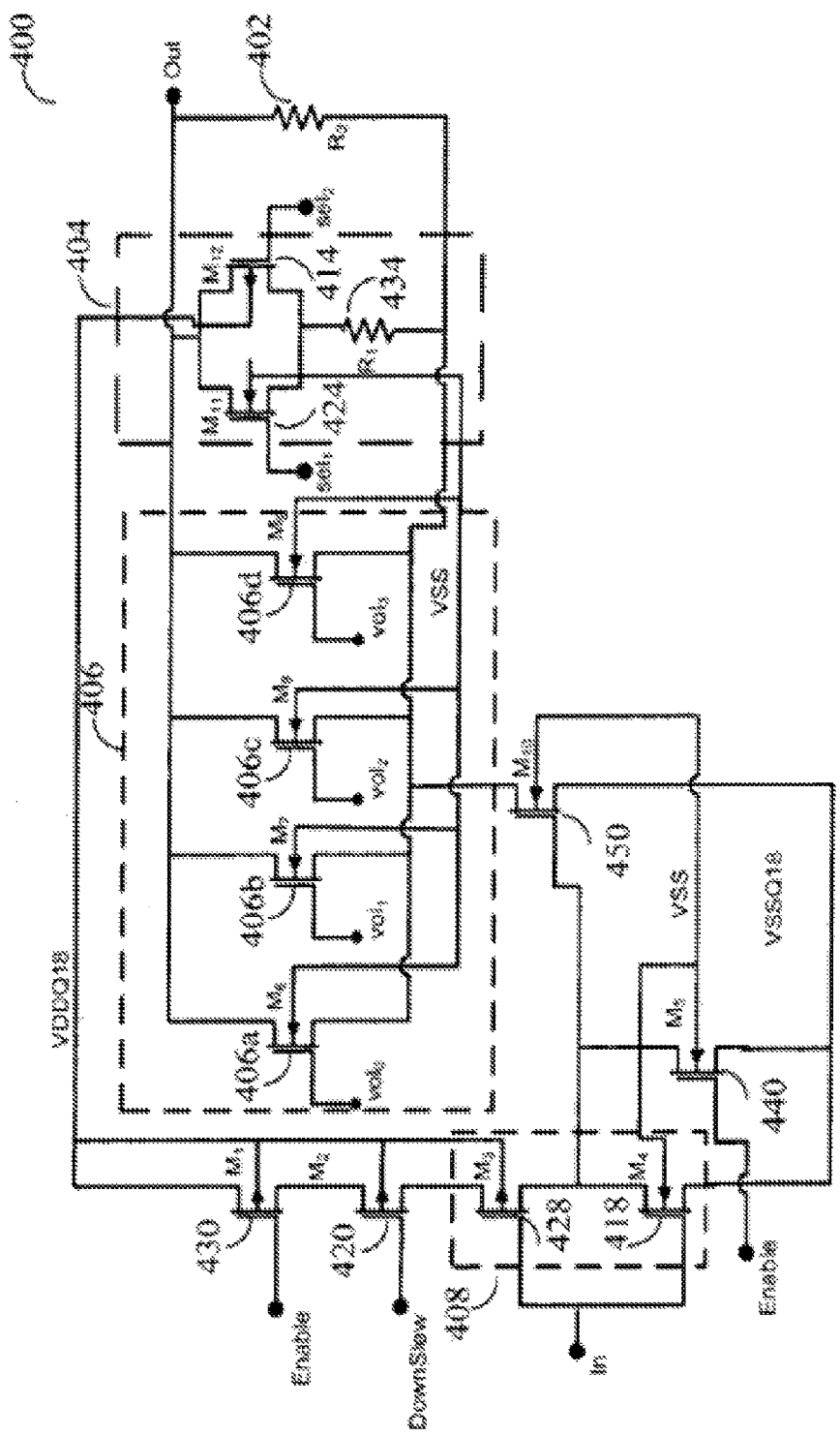
FIG. 4 shows a pull-down circuit with programmable impedance in accordance with the exemplary embodiment.

FIG. 4 shows a pull-down circuit with programmable impedance according to an exemplary embodiment.

Pull-down circuit 400 includes resistor 402, selectable resistor 404 and MOS transistors configuration 406. Resistor 402 is coupled in parallel to selectable resistor 404. MOS transistors configuration 406 is coupled in parallel to resistor 402 and to selectable resistor 404. As a result, the total selectable impedance of each pull-up circuit is the sum of impedances presented by the parallel connection of resistor 402, selectable resistor 404 and MOS transistor configuration 406.

Selectable resistor 404 is not selected during operation according to the DDR3 protocol and it is only selected during operation according to the DDR2 protocol MOS transistors configuration 406 comprises of a number of MOS transistors (4 shown, 406a, 406b 406c, 406d). During calibration a number of MOS transistors is selected in response to a calibration signal received in order to adjust (calibrate) the impedance value of the pull-down circuit to a desired value in response to a second signal from the calibration subsystem (not shown).

Pull-down circuit 400 further comprises input stage 408, slew rate control circuit 420, MOS transistors 430, 440 and 450. Input stage 408 receives an input signal and amplifies it. Slew rate control circuit 430 controls the slew rate of the pull-circuit. MOS transistor 430 and 440 enable or disable pull-down circuit 400 in response to an external control signal. MOS transistor 450 is coupled to an output of input stage 408 and acts as a source follower that drives the parallel combination of resistor 402, selectable resistor 403 and MOS transistors configuration 406.

Resistor 402 is typically designed to have a resistance value larger than the desired impedance during DDR2 operation. In the exemplary embodiment of FIG. 2 the desired impedance, during DDR2 operation, for each pull-down circuit is 150 Ohm. This allows the impedance of the pull-down circuit to be adjusted appropriately to the desired impedance value when a number of MOS transistors of the MOS transistors configuration 406 are selected. As a result the impedance of each pull-down circuit can be adjusted to the desired value, for example 150 Ohm, to account for process, voltage and temperature variation through the employment of the calibration mechanism.

Selectable resistor 404 comprises of resistor 434 in series with a transmission gate that comprises of MOS transistors 414 and 424.

During DDR3 operation the transmission gate is off thus the selectable resistor is not selected. In this mode of operation the total impedance presented by the pull-down circuit is the impedance resulting from the parallel combination of resistor 402 and the MOS transistors from the MOS transistors configuration 406 that are selected.

During DDR2 operation the transmission gate is on thus the selectable resistor is selected. In this mode of operation the total impedance presented by the pull-down circuit is the impedance resulting for the parallel combination of resistor 402, selected resistor 404 and the MOS transistors from the MOS transistors configuration 406 that are selected.

Figure 5:
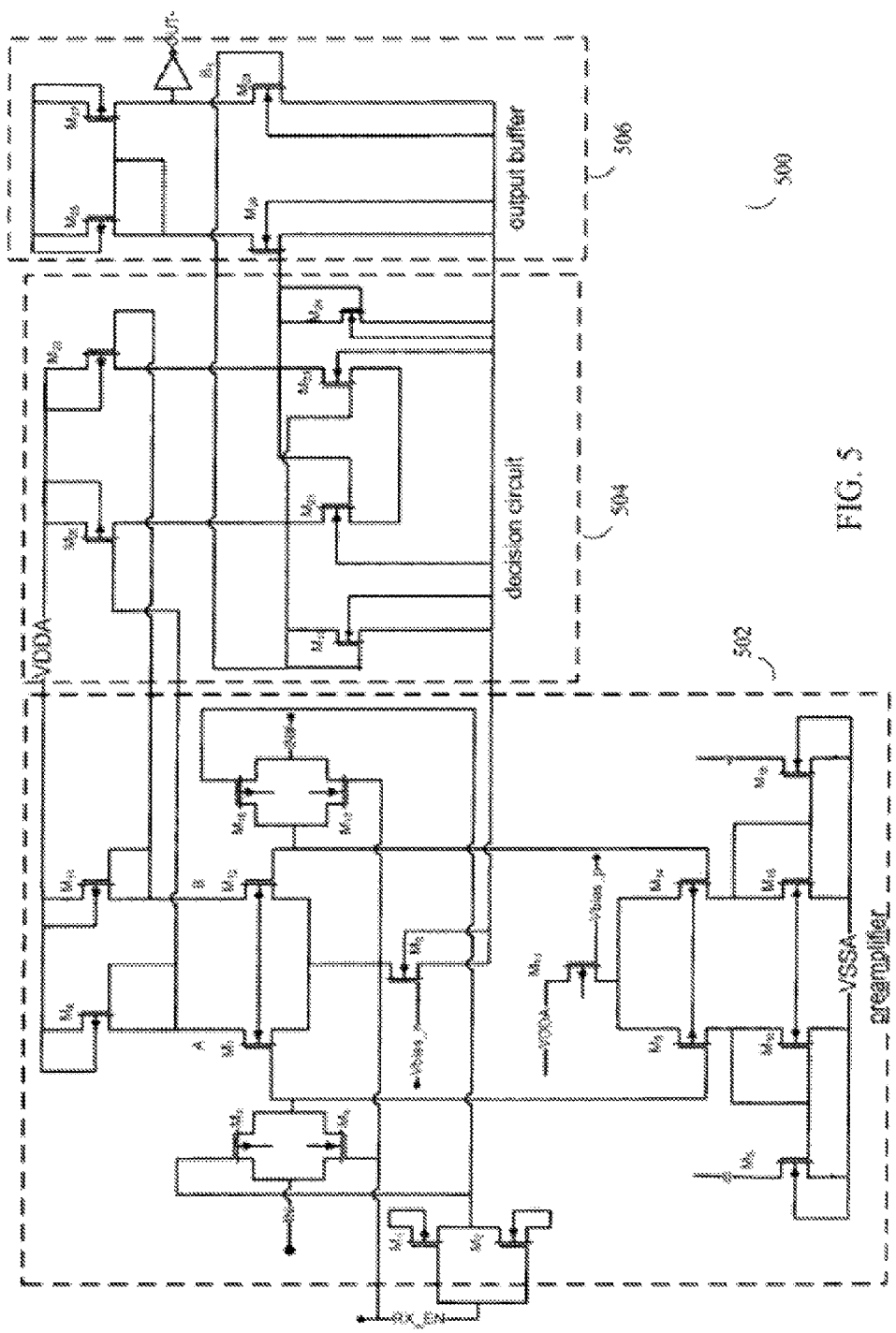
FIG. 5 shows an input driver according to an exemplary embodiment.

FIG. 5 shows an input driver according to an exemplary embodiment. Input driver 500 comprises preamplifier 502, decision stage 504 and output buffer 506. The preamplifier amplifies the input signals in order to improve the sensitivity of the driver. The decision stage determines which of the two input signals is larger. The output buffer amplifies the output of the decision stage and transforms it to a digital signal.
The preamplifier consists of a differential pair with active loads. The circuit does not include any high resistance nodes, typically a prerequisite to ensure a high operation speed. The decision stage uses positive feedback to increase the gain of the decision stage. As regards the output buffer, its purpose is to transform the output of the decision stage to logic signal. It receives a differential signal at its input, and has no limitations as regards the slew rate. As a final stage, an inverter is used in order to obtain a higher amplification and to isolate the capacitive charge from the self-biased differential amplifier.

Figure 6:
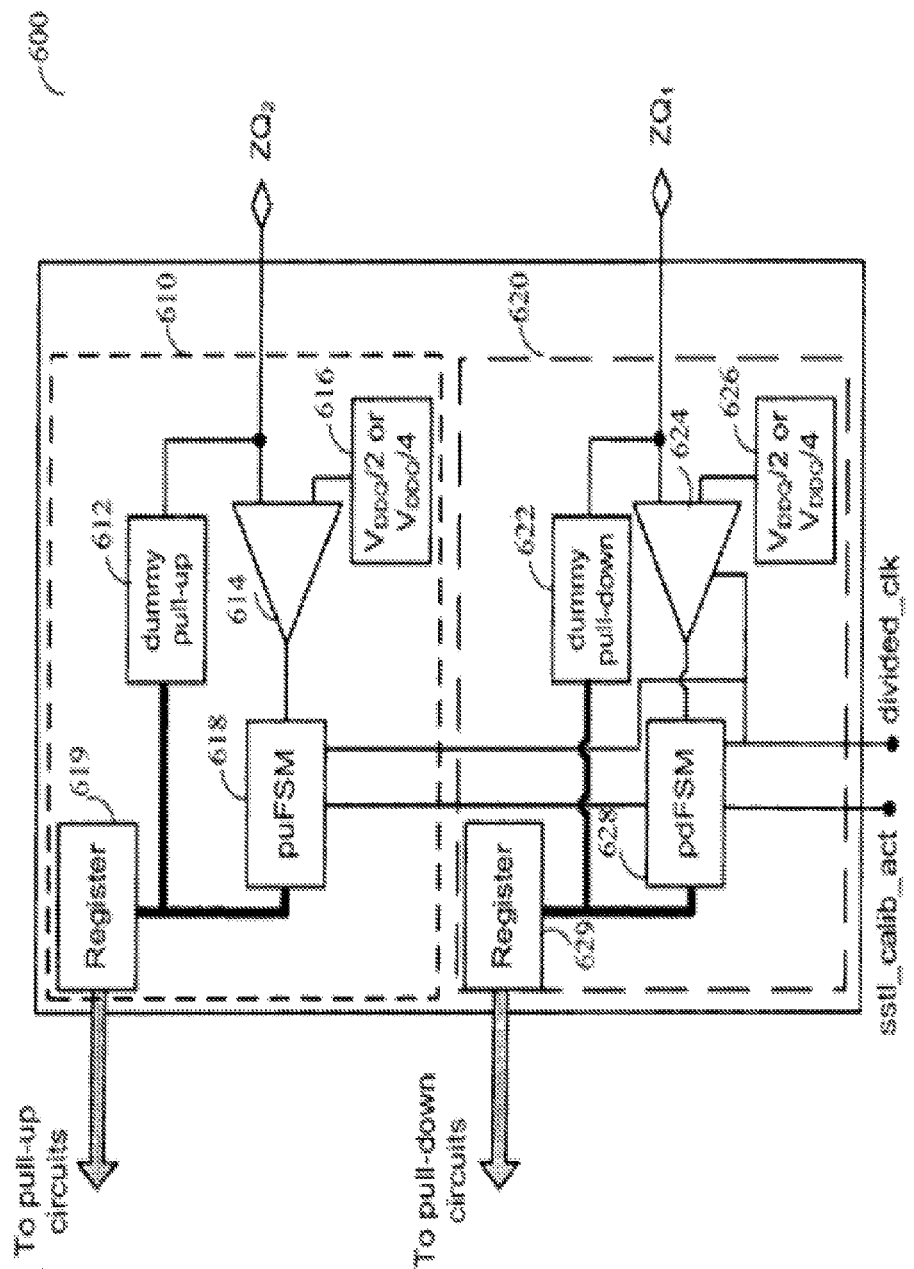
FIG. 6 shows a calibration circuit according to an exemplary embodiment.

FIG. 6 shows a calibration circuit according to an exemplary embodiment. Calibration circuit 600 is an exemplary embodiment for implementing calibration subsystem 106 of FIG. 1. Calibration circuit 600 comprises first calibration block 610 and second calibration block 620.

First calibration block 610 is used to adjust (calibrate) the impedance presented by each pull-up circuit. Second calibration block 620 is used to adjust (calibrate) each pull-down circuit to overcome the impedance variation due to temperature, supply voltage and temperature changes.

First calibration block 610 comprises dummy pull-up circuit 612, comparator 614, voltage reference block 616, pull-up finite state machine 618 and register 619.

Second calibration block 620 comprises dummy pull-down circuit 622, comparator 624, voltage reference block 626, pull-down finite state machine 628 and register 629.

Comparator 614 compares the two voltage signals appearing at each input. The first voltage signal, at the input of comparator 614, is generated by the current flowing through dummy pull-down circuit 612 across an external resistor connected to terminal ZQ2. The second voltage signal, at the input of comparator 614, is generated by voltage reference block 616. Voltage reference block 616 may typically generate a voltage reference either equal to the power supply VDDQ or equal to half of the power supply or equal to a quarter of the power supply. When the input clock to comparator 614 is high, the first and the second voltage inputs of the comparator are compared. Comparator 614 is coupled to pull-up finite state machine 618. Pull-up finite state machine 618 is clocked by the clock that clocks comparator 614 and performs a binary search algorithm in order to find the optimal adjustment of the impedance of each pull-up circuit. Pull-up finite state machine 618 is coupled to register 619 to store a first control signal that is used to adjust (calibrate) the impedance value of each pull-up circuit of FIG. 3.

In a similar manner comparator 624 compares the two voltage signals appearing at each input. The first voltage signal at the input of comparator 624 is generated by current flowing through dummy pull-down circuit 622 across an external resistor connected to terminal ZQ1. The second voltage at the input of comparator 624 is generated by voltage reference block 626. Voltage reference block 626 may typically generate a voltage reference either equal to the power supply VDDQ or equal the half of the power supply or equal to a quarter of the power supply. When the input clock to comparator 624 is coupled to pull-down finite state machine 628, the first and the second voltage inputs of comparator 624 are compared. Pull-down finite state machine 628 is clocked by the clock that clocks comparator 624 and performs a binary search algorithm in order to find the optimal adjustment of the impedance of each pull-down circuit. Pull-down finite state machine 628 is coupled to register 629 to store a second control signal that is used to adjust (calibrate) the impedance value of each pull-down circuit of FIG. 3.

Since two independent state machines are responsible for the adjustment of the impedance of each pull-up circuit and each pull-down circuit, the adjustment of the impedance of each pull-up circuit is independent of that of the adjustment of each pull-down circuit. This results in more accurate adjustment of each pull-up and each pull-down circuit as the process, temperature and voltage variation of the pull-up circuits is not correlated to the process, temperature and voltage variation of the pull-down circuits.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A combined programmable drive and termination circuit for interfacing with both DDR2 and DDR3 memory modules, comprising:
   an input driver that receives data from a DDR2 memory module and a DDR3 memory module but not both at the same time; and
   a combined output/termination driver formed as a single circuit and coupled to the input driver to interface with the DDR2 memory module and the DDR3 memory module but not both at the same time, the combined output/termination driver presenting a first desired termination impedance to a signal associated with the data from the DDR2 memory module when interfacing with the DDR2 memory module and presenting a second desired termination impedance to a signal associated with the data from the DDR3 memory module when interfacing with the DDR3 memory module.

2. The circuit of claim 1, wherein the combined output/termination driver includes a plurality of pull-up circuits and a plurality of pull-down circuits, one of the plurality of pull-up circuits presenting a fixed impedance, one of the plurality of pull-down circuits presenting a fixed impedance, and each of the remaining pull-up circuits and the remaining pull-down circuits presenting the first desired termination impedance when interfacing with the DDR2 memory module and presenting the second desired termination impedance when interfacing with the DDR3 memory module.

3. The circuit of claim 2, wherein a combination of the remaining pull-up circuits and the remaining pull-down circuits is activated to set a termination impedance of the combined output/termination driver to the first desired impedance or the second desired impedance.

4. The circuit of claim 2, wherein each of the pull-up circuit and the pull-down circuit presenting the fixed impedance is configured to be activated only when interfacing with the DDR2 memory module.

5. The circuit of claim 4, further comprising a calibration block to adjust the first desired impedance and the second desired impedance of each of the remaining pull-up circuits and each of the remaining pull-down circuits in real time, wherein the calibration block includes a first state machine to adjust the first desired impedance and the second desired impedance of each of the remaining pull-up circuits and a second state machine to adjust the first desired impedance and the second desired impedance of each of the remaining pull-down circuits.

6. The circuit of claim 5, wherein each of the remaining pull-up circuits includes a resistor coupled in parallel to a selectable resistor, and wherein the selectable resistor is only selected when the second desired impedance is selected.

7. The circuit of claim 6, wherein each of the remaining pull-up circuits further includes a plurality of MOS transistors coupled in parallel to the resistor and to the selectable resistor for adjusting the first desired impedance and the second desired impedance of the remaining pull-up circuit in response to a control signal from the first state machine.

8. The circuit of claim 5, wherein each of the remaining pull-down circuits includes a resistor coupled in parallel to a selectable resistor, and wherein the selectable resistor is only selected when the second desired impedance is selected.

9. The circuit of claim 8, wherein each of the remaining pull-down circuits further includes a plurality of MOS transistors coupled in parallel to the resistor and to the selectable resistor for adjusting the first desired impedance and the second desired impedance of the remaining pull-down circuit in response to a control signal from the second state machine.

10. The circuit of claim 1, wherein the combined output/termination driver comprises a plurality of pull-up circuits and a plurality of pull-down circuits selectively programmable to achieve the first desired termination impedance and the second desired termination impedance to set the termination impedance of the combined output/termination driver to the termination impedance required when interfacing with the DDR2 memory module and the DDR3 memory module, respectively.

11. A computer processor for interfacing with a DDR2 memory module and a DDR3 memory module via a driver, comprising:
   means for receiving and sending data to/from the DDR2 memory module and the DDR3 memory module, but not both at the same time, via an input driver in the driver; and means for programming a calibration block to selectively activate and deactivate appropriate pull-up and pull-down circuits in a combined output/termination driver formed as a single circuit coupled to the input driver to interface with the DDR2 memory module and the DDR3 memory module, but not both at the same time, so as to present an output impedance from a first set of impedance values to a signal associated with the data received from the DDR2 memory module when interfacing with the DDR2 memory module, and so as to present an output impedance from a second set of impedance values to a signal associated with the data received from the DDR3 memory module when interfacing with the DDR3 memory module.

12. The computer processor of claim 11, wherein one of the pull-up circuits and one of the pull-down circuits presents a fixed impedance value and is configured to be activated only when interfacing with the DDR2 memory module.

13. The computer processor of claim 11, wherein the calibration block is of a type including a first state machine to adjust the impedance of each pull-up circuit and a second state machine to adjust the impedance of each pull-down circuit in response to signals from the computer processor.

14. The computer processor of claim 11, wherein each pull-up circuit in the combined output/termination driver is of a type including a resistor coupled in parallel to a selectable resistor, where the selectable resistor is only selected when an impedance from the second set of impedance values is desired.

15. The computer processor of claim 14, wherein each pull-up circuit further includes a plurality of MOS transistors coupled in parallel to the resistor and to the selectable resistor for adjusting the impedance value of the pull-up circuit in response to a control signal from the first state machine.

16. A combined drive and termination circuit programmable to interface to DDR2 and DDR3 memory modules, comprising:
an input driver that receives data from the DDR2 memory module and the DDR3 memory module but not both at the same time; and
a combined output/termination driver coupled to the input driver and configured as a single driver including a plurality of pull-up circuits and a plurality of pull-down circuits for allowing a computer processor to interface with the DDR2 and DDR3 memory modules but not both at the same time;
wherein the plurality of pull-up circuits are configured so that one of the pull-up circuits present a fixed output impedance that is activated only when interfacing with the DDR2 protocol and so that the remaining pull-up circuits are programmable between two desired impedance values when interfacing with the DDR2 and DDR3 modules, respectively;
wherein the plurality of pull-down circuits are configured so that one of the pull-down circuits present a fixed output impedance that is activated only when interfacing with the DDR2 memory module and so that the remaining pull-down circuits are programmable between two desired impedance values when interfacing with the DDR2 and DDR3 memory modules, respectively; and
wherein activation of an appropriate number of the plurality of pull-up and pull-down circuits sets a termination impedance of the combined output/termination driver to the termination impedance required to interface with the DDR2 and the DDR3 memory modules but not both at the same time.

17. The circuit of claim 16, wherein each of the plurality of pull-up circuits comprises a resistor, a selectable resistor coupled in parallel to the resistor and being configured to be selected only when interfacing with the DDR2 memory module, and a plurality of MOS transistors coupled in parallel to the resistor and the selectable resistor.

18. The circuit of claim 17, further comprising a calibration subsystem having a first calibration block for calibrating the impedance presented by each of the plurality of pull-up circuits and having a second calibration block for calibrating each of the plurality of pull-down circuits to overcome impedance variation due to changes in temperature and supply voltage.

19. The circuit of claim 18, wherein the combined output/termination driver is configured so that during calibration by the first calibration block, a number of the MOS transistors is selected in response to a received calibration signal in order to calibrate the impedance value of the pull-up circuit to a desired value.

20. The circuit of claim 17, wherein each of the plurality of pull-down circuits comprises a resistor, a selectable resistor coupled in parallel to the resistor of the pull-down circuit and being configured to be selected only when interfacing with the DDR2 memory module, and a plurality of MOS transistors coupled in parallel to the resistor and the selectable resistor of the pull-down circuit.

* * * * *